US011255012B2

(12) United States Patent
Abraham et al.

(10) Patent No.: US 11,255,012 B2
(45) Date of Patent: *Feb. 22, 2022

(54) ELECTRICALLY AND MAGNETICALLY ENHANCED IONIZED PHYSICAL VAPOR DEPOSITION UNBALANCED SPUTTERING SOURCE

(71) Applicant: IonQuest Corp., Mansfield, MA (US)

(72) Inventors: Bassam Hanna Abraham, Millis, MA (US); Roman Chistyakov, North Andover, MA (US)

(73) Assignee: IonQuest Corp., Milford, MA (US)

( * ) Notice: Subject to any disclaimer, the term of this patent is extended or adjusted under 35 U.S.C. 154(b) by 418 days.

This patent is subject to a terminal disclaimer.

(21) Appl. No.: 16/400,539

(22) Filed: May 1, 2019

(65) Prior Publication Data

US 2019/0271070 A1    Sep. 5, 2019

Related U.S. Application Data

(62) Division of application No. 15/260,857, filed on Sep. 9, 2016, now abandoned.
(Continued)

(51) Int. Cl.
*H01L 21/285* (2006.01)
*H01J 37/32* (2006.01)
(Continued)

(52) U.S. Cl.
CPC ........ *C23C 14/354* (2013.01); *C23C 14/0057* (2013.01); *C23C 14/0605* (2013.01);
(Continued)

(58) Field of Classification Search
CPC ..... C23C 14/354; C23C 14/355; C23C 14/35; C23C 16/505
(Continued)

(56) References Cited

U.S. PATENT DOCUMENTS 3,767,551 A * 10/1973 Lang, Jr. ................. C23C 14/35
204/192.12
4,588,490 A    5/1986 Cuomo et al.
(Continued)

FOREIGN PATENT DOCUMENTS

WO    2014/053209         4/2014
WO    2016/028640 A1      2/2016
(Continued)

OTHER PUBLICATIONS

Non-Final Office Action received for U.S. Appl. No. 15/260,857 dated Mar. 9, 2018, 38 pages.
(Continued)

*Primary Examiner* — John J Brayton
(74) *Attorney, Agent, or Firm* — FisherBroyles, LLP

(57) ABSTRACT

An electrically and magnetically enhanced ionized physical vapor deposition (I-PVD) magnetron apparatus and method is provided for sputtering material from a cathode target on a substrate, and in particular, for sputtering ceramic and diamond-like coatings. The electrically and magnetically enhanced magnetron sputtering source has unbalanced magnetic fields that couple the cathode target and additional electrode together. The additional electrode is electrically isolated from ground and connected to a power supply that can generate positive, negative, or bipolar high frequency voltages, and is preferably a radio frequency (RF) power supply. RF discharge near the additional electrode increases plasma density and a degree of ionization of sputtered material atoms.

13 Claims, 10 Drawing Sheets

Related U.S. Application Data

(60) Provisional application No. 62/270,356, filed on Dec. 21, 2015.

(51) Int. Cl.

| C23C 14/35 | (2006.01) |
|---|---|
| C23C 14/34 | (2006.01) |
| H01J 37/34 | (2006.01) |
| H01L 21/768 | (2006.01) |
| H01L 23/522 | (2006.01) |
| H01L 23/532 | (2006.01) |
| C23C 14/00 | (2006.01) |
| C23C 14/06 | (2006.01) |
| C23C 14/14 | (2006.01) |
| C23C 16/505 | (2006.01) |

(52) U.S. Cl.
CPC ............ *C23C 14/14* (2013.01); *C23C 14/345* (2013.01); *C23C 14/3485* (2013.01); *C23C 14/35* (2013.01); *C23C 16/505* (2013.01); *H01J 37/321* (2013.01); *H01J 37/32825* (2013.01); *H01J 37/345* (2013.01); *H01J 37/3405* (2013.01); *H01J 37/3417* (2013.01); *H01J 37/3426* (2013.01); *H01J 37/3435* (2013.01); *H01J 37/3452* (2013.01); *H01J 37/3455* (2013.01); *H01J 37/3464* (2013.01); *H01J 37/3467* (2013.01); *H01L 21/2855* (2013.01); *H01L 21/76843* (2013.01); *H01L 21/76871* (2013.01); *H01L 21/76879* (2013.01); *H01L 21/76882* (2013.01); *H01L 23/5226* (2013.01); *H01L 23/53238* (2013.01)

(58) Field of Classification Search
USPC .................................................. 204/298.14
See application file for complete search history.

(56) References Cited

U.S. PATENT DOCUMENTS

| 5,178,739 | A | * | 1/1993 | Barnes .................. C23C 14/345 |
|---|---|---|---|---|
| | | | | 204/192.12 |
| 5,227,211 | A | | 7/1993 | Eltoukhy et al. |
| 5,482,611 | A | | 1/1996 | Helmer et al. |
| 5,651,865 | A | | 7/1997 | Sellers |
| 6,024,843 | A | | 2/2000 | Anderson et al. |
| 6,077,403 | A | | 6/2000 | Kobayashi et al. |
| 6,216,632 | B1 | | 4/2001 | Wickramanayaka |
| 6,903,511 | B2 | | 6/2005 | Chistyakov |
| 7,095,179 | B2 | | 8/2006 | Chistyakov |
| 7,327,089 | B2 | | 2/2008 | Madocks |
| 7,898,183 | B2 | | 3/2011 | Chistyakov et al. |
| 8,696,875 | B2 | | 4/2014 | Ding et al. |
| 9,267,200 | B2 | | 2/2016 | Krassnitzer et al. |
| 9,624,571 | B2 | | 4/2017 | Arndt et al. |
| 9,771,647 | B1 | | 9/2017 | Scobey et al. |
| 9,951,414 | B2 | | 4/2018 | Chistyakov |
| 10,227,691 | B2 | * | 3/2019 | Abraham ............ H01J 37/3464 |
| 10,227,692 | B2 | | 3/2019 | Chistyakov et al. |
| 10,480,063 | B2 | | 11/2019 | Chistyakov et al. |
| 10,913,998 | B2 | | 2/2021 | Chistyakov et al. |
| 10,957,519 | B2 | * | 3/2021 | Chistyakov ......... C23C 16/5093 |
| 2001/0050220 | A1 | | 12/2001 | Chiang et al. |
| 2004/0089541 | A1 | | 5/2004 | Matsumoto et al. |
| 2004/0095497 | A1 | | 5/2004 | Compton et al. |
| 2004/0227470 | A1 | | 11/2004 | Benveniste et al. |
| 2006/0066248 | A1 | | 3/2006 | Chistyakov |
| 2006/0278521 | A1 | | 12/2006 | Stowell |
| 2006/0290399 | A1 | | 12/2006 | MacDougall et al. |
| 2008/0190760 | A1 | | 8/2008 | Tang et al. |
| 2009/0321249 | A1 | | 12/2009 | Chistyakov et al. |
| 2011/0011737 | A1 | | 1/2011 | Wu et al. |
| 2014/0041800 | A1 | | 2/2014 | Okuyama et al. |
| 2014/0305795 | A1 | | 10/2014 | Bardos et al. |
| 2015/0348773 | A1 | | 12/2015 | Zhu et al. |
| 2017/0178878 | A1 | | 6/2017 | Abraham et al. |
| 2017/0178912 | A1 | | 6/2017 | Chistyakov et al. |
| 2018/0374688 | A1 | | 12/2018 | Chistyakov et al. |
| 2018/0374689 | A1 | | 12/2018 | Abraham et al. |
| 2019/0249293 | A1 | | 8/2019 | Abraham et al. |
| 2019/0256969 | A1 | | 8/2019 | Chistyakov et al. |
| 2019/0316249 | A1 | | 10/2019 | Abraham et al. |
| 2020/0176234 | A1 | | 6/2020 | Abraham et al. |
| 2021/0102284 | A1 | | 4/2021 | Abraham et al. |
| 2021/0115552 | A1 | | 4/2021 | Abraham et al. |
| 2021/0115553 | A1 | | 4/2021 | Abraham |
| 2021/0317569 | A1 | | 10/2021 | Abraham |

FOREIGN PATENT DOCUMENTS

| WO | 2017/112696 A1 | 6/2017 |
|---|---|---|
| WO | 2017/112700 A1 | 6/2017 |
| WO | 2018/186901 A1 | 10/2018 |

OTHER PUBLICATIONS

Final Office Action received for U.S. Appl. No. 15/260,857 dated Nov. 19, 2018, 16 pages.
Non-Final Office Action received for U.S. Appl. No. 15/260,841 dated Jan. 9, 2019, 8 pages.
Notice of Allowance received for U.S. Appl. No. 15/260,841 dated May 28, 2019, 24 pages.
Helmersson et al., "Ionized physical vapor deposition (IPVD): A review of technology and applications", URL: http://run.kb.se/resolve?um=um:nbn:se:liu:diva-10434, Postprint available: Linkoping University E-Press, Article in Thin Solid Films, Aug. 14, 2006, 61 pages.
International Search Report and Written Opinion received for PCT Application Serial No. PCT/US2017/048438 Nov. 3, 2017, 10 pages.
Non-Final Office Action received for U.S. Appl. No. 15/261,119 dated Jun. 26, 2017, 14 pages.
Final Office Action received for U.S. Appl. No. 15/261,119 dated Oct. 30, 2017, 11 pages.
Notice of Allowance received for U.S. Appl. No. 15/261,119 dated Jan. 26, 2018, 14 pages.
Non-Final Office Action received for U.S. Appl. No. 15/917,046 dated Jun. 22, 2018, 17 pages.
Notice of Allowance received for U.S. Appl. No. 15/917,046 dated Oct. 29, 2018, 19 pages.
Non-Final Office Action received for U.S. Appl. No. 15/261,197 dated Jun. 18, 2018, 14 pages.
Notice of Allowance received for U.S. Appl. No. 15/261,197 dated Oct. 31, 2018, 18 pages.
International Search Report and Written Opinion received for PCT Application Serial No. PCT/US2016/067850 dated Mar. 9, 2017, 7 pages.
International Preliminary Report on Patentability received for PCT Application Serial No. PCT/US2016/067850 dated Jul. 5, 2018, 7 pages.
Wang et al., "Hollow cathode magnetron", Journal of Vacuum Science & Technology A, vol. 17, No. 1, 1999, pp. 77-82.
International Search Report and Written Opinion received for PCT Application Serial No. PCT/US2016/067838 dated Mar. 16, 2017, 7 pages.
International Preliminary Report on Patentability received for PCT Application Serial No. PCT/US2016/067838 dated Jul. 5, 2018, 6 pages.
Abraham et al., "Electrically and Magnetically Enhanced Ionized Physical Vapor Deposition Unbalanced Sputtering Source", U.S. Appl. No. 16/284,327 dated Feb. 25, 2019, 114 pages.
Chistyakov et al., "Magnetically Enhanced High Density Plasma-Chemical Vapor Deposition Plasma Source for Depositing Diamond and Diamond-Like Films", U.S. Appl. No. 16/261,514 dated Jan. 29, 2019, 62 pages.

(56) References Cited

OTHER PUBLICATIONS

Abraham et al., "Magnetically Enhanced Low Temperature-High Density Plasma-Chemical Vapor Deposition Plasma Source for Depositing Diamond and Diamond Like Films", U.S. Appl. No. 16/261,516 dated Jan. 29, 2019, 60 pages.
Abraham et al., "High-Power Resonance Pulse Ac Hedp Sputtering Source and Method for Material Processing", U.S. Appl. No. 16/025,928 dated Jul. 2, 2018, 76 pages.
Non-Final Office Action received for U.S. Appl. No. 16/063,283 dated Sep. 22, 2020, 23 pages.
Non-Final Office Action received for U.S. Appl. No. 16/025,928 dated Sep. 25, 2020, 24 pages.
Final Office Action received for U.S. Appl. No. 16/063,283 dated Mar. 18, 2021, 32 pages.
Non-Final Office Action received for U.S. Appl. No. 16/063,283 dated Aug. 19, 2021, 21 pages.
Non-Final Office Action received for U.S. Appl. No. 16/261,514 dated Jun. 29, 2020, 26 pages.
Notice of Allowance received for U.S. Appl. No. 16/261,514 dated Oct. 9, 2020, 81 pages.
Non-Final Rejection received for U.S. Appl. No. 16/063,284 dated Jan. 30, 2020, 26 pages.
Non-Final Rejection received for U.S. Appl. No. 16/063,284 dated May 20, 2020, 12 pages.
Notice of Allowance received for U.S. Appl. No. 16/063,284 dated Dec. 17, 2020, 36 pages.
Non-Final Rejection received for U.S. Appl. No. 16/261,516 dated Jun. 29, 2020, 28 pages.
Notice of Allowance received for U.S. Appl. No. 16/261,516 dated Oct. 19, 2020, 24 pages.
International Preliminary Report on Patentability received for PCT Application Serial No. PCT/US2017/048438 dated Oct. 17, 2019, 8 pages.
Abraham et al., "Magnetically Enhanced High Density Plasma-Chemical Vapor Deposition Plasma Source for Depositing Diamond and Diamond-Like Films", U.S. Appl. No. 17/124,749, filed Dec. 17, 2020, 62 pages.
Abraham et al., "Magnetically Enhanced High Density Plasma-Chemical Vapor Deposition Plasma Source for Depositing Diamond and Diamond-Like Films", U.S. Appl. No. 17/124,691, filed Dec. 17, 2020, 63 pages.
Abraham, Bassam Hanna, "Magnetically Enhanced High Density Plasma-Chemical Vapor Deposition Plasma Source for Depositing Diamond and Diamond-Like Films", U.S. Appl. No. 17/127,527, filed Dec. 18, 2020, 172 pages.
Abraham, Bassam Hanna, "Magnetically Enhanced High Density Plasma-Chemical Vapor Deposition Plasma Source for Depositing Diamond and Diamond-Like Films", U.S. Appl. No. 17/352,168, filed Jun. 18, 2021, 172 pages.
Non-Final Office Action received for U.S. Appl. No. 16/284,327 dated Sep. 15, 2021, 42 pages.
Non-Final Office Action received for U.S. Appl. No. 17/124,691 dated Nov. 1, 2021, 42 pages.
Non-Final Office Action received for U.S. Appl. No. 17/124,749 dated Nov. 5, 2021, 44 pages.

\* cited by examiner

ELECTRICALLY AND MAGNETICALLY ENHANCED IONIZED PHYSICAL VAPOR DEPOSITION UNBALANCED SPUTTERING SOURCE

CROSS-REFERENCE TO RELATED APPLICATIONS

This application is a divisional of U.S. patent application Ser. No. 15/260,857, filed Sep. 9, 2016, which claims the benefit of U.S. Provisional Application No. 62/270,356, filed Dec. 21, 2015, the disclosures of which are incorporated herein by reference in their entirety. U.S. application Ser. No. 15/260,841 entitled "Capacitive Coupled Plasma Source for Sputtering and Resputtering", U.S. application Ser. No. 15/261,119 entitled "Magnetically Enhanced High Density Plasma-Chemical Vapor Deposition Plasma Source for Depositing Diamond and Diamond-Like Films", and U.S. application Ser. No. 15/261,197 entitled "Magnetically Enhanced Low Temperature-High Density Plasma-Chemical Vapor Deposition Plasma Source for Depositing Diamond and Diamond Like Films" filed on Sep. 9, 2016 are incorporated herein by reference in their entireties.

BACKGROUND

Field

The disclosed embodiments generally relate to an ionized physical vapor deposition (I-PVD) apparatus and method for sputtering target material on a surface of a substrate. In particular, the disclosed embodiments relate to an apparatus and method of generating high density capacitive coupled plasma (CCP) for sputtering applications in addition to a cathode sputtering target discharge. The disclosed embodiments also relate to electrically and magnetically enhanced unbalanced magnetron or non-magnetron sputtering apparatuses and methods.

Related Art

An ionized physical vapor deposition (I-PVD) sputtering and resputtering process can be performed in the same process module in the presence of an additional inductively coupled plasma (ICP) source. An example of such an apparatus and process is described in U.S. Publication No. 2008/0190760A1, which is incorporated herein by reference in its entirety. The I-PVD sputtering source is a magnetron sputtering source, in which magnetic field lines terminate on a target surface. The resputtering process, which is sputter etching, can be performed with argon gas ions or sputtered copper ions. In order to increase ionization of the gas and sputtered material ions, an ICP coil is positioned in a vacuum chamber between a magnetron sputtering source and a substrate.

SUMMARY

The disclosed embodiments relate to an electrically and magnetically enhanced I-PVD unbalanced magnetron and non-magnetron apparatus and method for sputtering. Magnetic field geometry of the electrically and magnetically enhanced unbalanced magnetron sputtering source has an unbalanced magnetron configuration on a cathode target surface. Magnetic field lines that form a magnetron configuration on the cathode target surface are unbalanced from the center. In some embodiments, magnetic field lines are unbalanced from the edges. The unbalanced magnetic field lines are terminated on magnet assembly positioned inside an additional electrode that is electrically isolated from ground and positioned around the cathode target. The additional electrode is connected to a power supply that can generate a positive, negative or high frequency bipolar voltage with a frequency in the range of 100 KHz to 100 MHz. In some embodiments, the additional electrode is connected to the power supply that generates an RF voltage. In some embodiments, the additional electrode can be made from cathode target material. In some embodiments, the additional electrode is not connected to any power supply and has a floating potential. In some embodiments, at least a portion of the magnetic field lines passing the gap are positioned adjacent to the additional electrode prior to terminating on the magnets. The gap can be formed between the anode and additional to the cathode target gap cathode. The gap cathode can be connected with an RF power supply. The RF power supply can generate voltage oscillations with a frequency are in the range of 100 kHz to 100 MHz. The gap cathode can be grounded through an inductor to eliminate negative voltage bias generated by RF discharge. In some embodiments, magnetic field geometry of the electrically and magnetically enhanced sputtering source does not form a magnetron configuration on a cathode target surface. In this case, magnetic field lines on the cathode target surface are substantially perpendicular to the cathode target surface. In some embodiments, the additional electrode magnet assembly forms a cusp magnetic field. In some embodiments, the additional electrode magnet assembly forms a cusp magnetic field in the gap.

The electrically and magnetically enhanced I-PVD unbalanced sputtering source according to the disclosed embodiments includes a cathode target assembly connected to the power supply, an additional electrode assembly electrically isolated from ground, a power supply connected to the additional electrode assembly, a first additional electrode magnet assembly magnetically coupling the additional electrode assembly and the cathode target, a stationary or rotating cathode magnet assembly that generates an unbalanced magnetron magnetic field configuration on the target surface, an anode that is connected to ground, and a flowing liquid that cools and controls the temperature of the cathode.

The magnetically and electrically enhanced I-PVD unbalanced sputtering source may include: a second additional electrode magnet assembly, an electrical circuit that has at least one inductor connected between an additional electrode and ground, and an electrical circuit that has at least one inductor connected between a cathode target assembly and ground, as well as a gap that has a gap cathode and positioned around the additional electrode.

The electrically and magnetically enhanced I-PVD unbalanced magnetron sputtering apparatus includes an electrically and magnetically enhanced I-PVD unbalanced magnetron sputtering source, vacuum chamber, substrate holder, substrate, feed gas mass flow controller, and a vacuum pump.

The electrically and magnetically enhanced I-PVD unbalanced magnetron sputtering apparatus may include a substrate heater, controller, computer, feed gas activation source, substrate bias power supply, and an additional electrically and magnetically enhanced I-PVD unbalanced magnetron sputtering source.

A method of providing electrically and magnetically enhanced I-PVD unbalanced magnetron sputtering includes positioning an electrically and magnetically enhanced I-PVD unbalanced magnetron sputtering source inside a vacuum chamber, positioning a substrate on the substrate holder, applying electrical potential to the additional electrode assembly, providing feed gas, applying power between the cathode target and the anode to form a plasma, and depositing a layer of target material on the substrate surface.

A method of providing electrically and magnetically enhanced sputtering may include applying power to the substrate holder to generate substrate bias, attracting positive ions from sputtered target material atoms to the substrate, applying heat to the substrate, and flowing feed gas through a gas activation source.

A method of depositing a layer on a substrate includes applying a magnetic field to a cathode target to generate an unbalanced magnetic field and a magnetron configuration on the cathode target; electrically coupling an additional electrode to a ground electrical potential using an electrical circuit comprising an inductor; electrically coupling the additional electrode to a radio frequency (RF) power supply; generating magnetic coupling between the cathode target and the anode; providing a feed gas; and applying power to the cathode target, wherein the RF power supply provides a power selected to increase ionization of sputtered target material atoms associated with the cathode target during sputtering.

The method may include coupling a DC power supply to the cathode, wherein the DC power supply provides output power in a range of 1 to 100 kW. The feed gas may include a noble gas including at least one of argon, xenon, neon, and krypton. The feed gas may include a mixture of a noble gas and a reactive gas. The method may include coupling the RF power supply to the cathode target, wherein the RF power supply provides output power in a range of 1 to 20 kW; and coupling a substrate bias voltage to a substrate holder, wherein the substrate bias voltage comprising a range of −10 V to −200 V. The feed gas may include a mixture of a noble gas and a reactive gas; and a mixture of a noble gas and a gas that comprises atoms of the cathode target material. The method may include coupling a pulsed DC power supply to the cathode target, wherein the pulsed DC power supply provides an output peak power during a pulse in a range of 10 to 1000 kW.

An electrically and magnetically enhanced ionized physical vapor deposition (I-PVD) unbalanced sputtering apparatus that deposits a layer on a substrate includes a vacuum chamber; a cathode target magnet assembly that generates an unbalanced magnetic field and provides a magnetron configuration on a target surface; an additional electrode coupled to a ground electrical potential using an electrical circuit comprising an inductor, wherein the anode is coupled to a radio frequency (RF) power supply; an additional electrode magnet assembly that generates magnetic coupling between a cathode target and the additional electrode; a feed gas; a power supply coupled to the cathode magnet target assembly, wherein the power supply generates a magnetron discharge, and the RF power supply provides a power selected to increase an ionization of atoms associated with the cathode target during sputtering.

The power supply coupled to the cathode target assembly may include a DC power supply providing output power in a range of 1 to 100 kW. The power supply coupled to the cathode target assembly may include a pulsed power supply providing a target power density during a pulse in a range of 0.1 to 5 kW/cm2. A pulsed power supply may generate bipolar asymmetrical voltage oscillations. The amplitude of the negative oscillations can be in the range of 500 V to 3000 V. The amplitude of positive oscillations can be in the range of 50 V to 500 V. The duration of the voltage oscillations can be in the range of 5 μs to 50 μs. The frequency of these oscillations can be in the range of 10 kHz to 200 kHz. The apparatus may include a substrate bias power supply coupled to a substrate holder, wherein the substrate bias power supply provides a bias voltage on a substrate in a range of −10 to −200 V. The feed gas may include a noble gas that includes at least one of argon, xenon, neon, and krypton; and/or a mixture of a noble gas and a reactive gas. Reactive gas can be $N_2$, $O_2$ and $H_2$. The power supply coupled to the cathode magnet target assembly may include a RF power supply providing output power in a range of 1 to 20 kW. The power supply coupled to the cathode magnet target assembly may include a pulsed RF power supply providing output power during the pulse in a range of 5 to 50 kW. The feed gas may include a mixture of a noble gas and gas that comprises atoms of the cathode target. The cathode magnet target assembly may rotate with a speed in a range of 10 to 100 revolutions per minute.

Other embodiments will become apparent from the following detailed description considered in conjunction with the accompanying drawings. It is to be understood, however, that the drawings are designed as an illustration only and not as a definition of the limits of any of the embodiments.

BRIEF DESCRIPTION OF THE DRAWINGS

The following drawings are provided by way of example only and without limitation, wherein like reference numerals (when used) indicate corresponding elements throughout the several views, and wherein.

It is to be appreciated that elements in the figures are illustrated for simplicity and clarity. Common but well-understood elements that are useful or necessary in a commercially feasible embodiment are not shown in order to facilitate a less hindered view of the illustrated embodiments.

DETAILED DESCRIPTION

Figure 1:
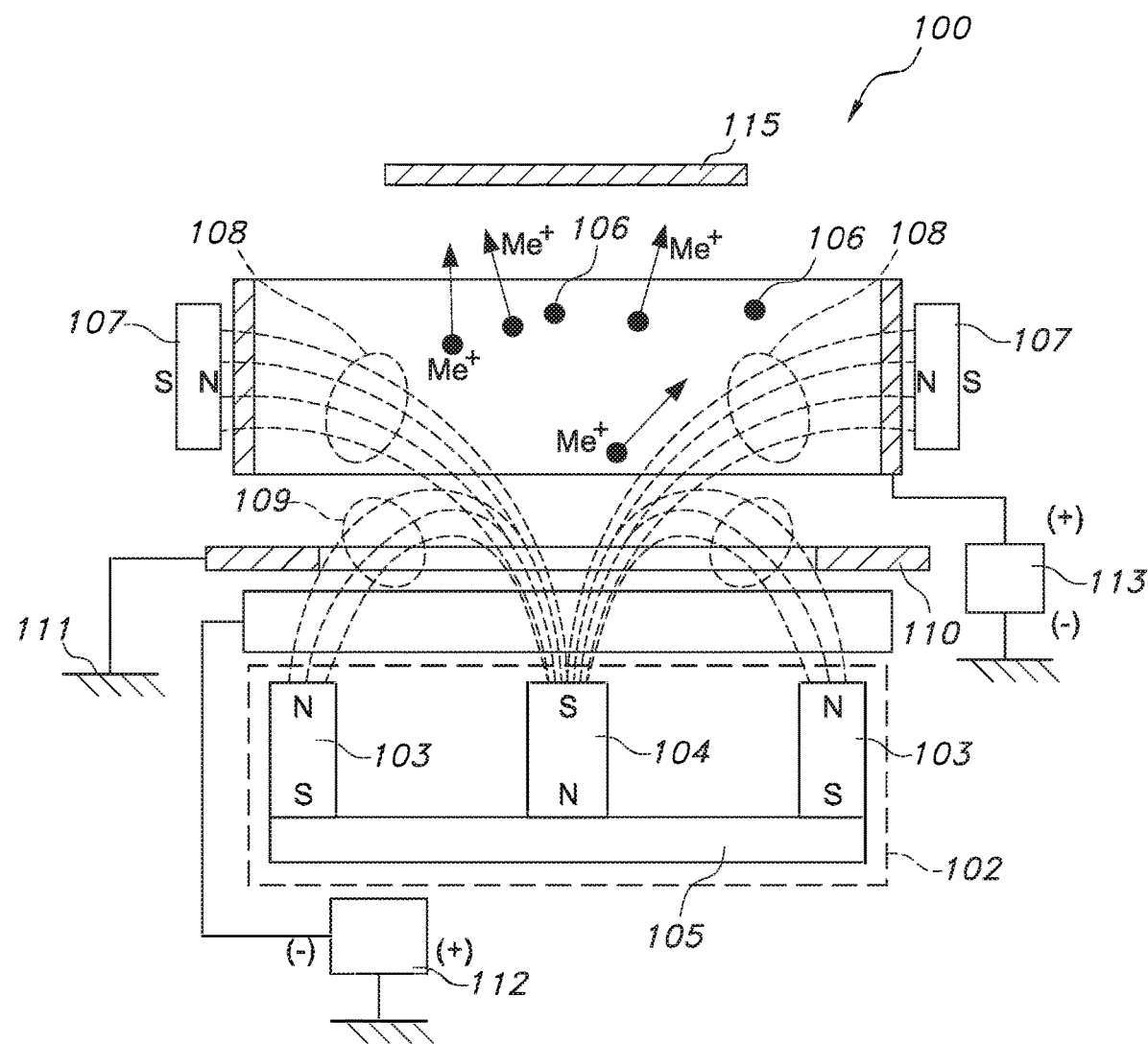
FIG. 1 shows an illustrative cross-sectional view of magnetic field lines of an embodiment of an electrically and magnetically enhanced I-PVD unbalanced magnetron sputtering source with one anode magnet assembly.

FIG. 1 shows a cross-sectional view 100 of magnetic field lines in an embodiment in which an additional electrode 106 has one magnet assembly. A cathode magnet assembly 102 includes magnets 103, 104 and magnetic pole piece 105. The cathode magnet assembly 102 forms a magnetron configuration with magnetic field lines 109 near a target surface 101. A portion of the magnetic field lines 108 cross the additional electrode 106 and terminate on the magnet 107. The additional electrode 106 is connected to a power supply 113. The power supply 113 can generate positive voltage. In an embodiment, the power supply 113 can generate high frequency bipolar asymmetrical voltages. In an embodiment, the power supply 113 can generate a radio frequency (RF) voltage with frequencies in the range of 100 KHz to 100 MHz. In an embodiment, the power supply 113 can generate a negative voltage. When the power supply 112 generates power and a magnetron discharge is formed near the cathode target 101, electrons drift from the target surface 101 towards the additional electrode 106. If power supply 113 provides a positive voltage, electrons are absorbed by the additional electrode 106 and the magnetron discharge has a positive space charge. The positive space charge accelerates a portion of the ionized sputtered target material atoms Me+ away from the target 101 towards a substrate 115. If power supply 113 provides a negative voltage, electrons are trapped between the target 101 and additional electrode 106. Some electrons escape on the anode 110, which has a ground potential. By controlling the value and duration of the negative output voltage from the power supply 113, the electron density can be controlled. By controlling the value and duration of the positive output voltage from the power supply 113, the ion energy and ion density near the substrate 115 can be controlled. In an embodiment, power supply 113 generates RF discharge near the surface of the additional electrode 106. RF discharge increases electron temperature and electron density and, therefore, the degree of ionization of sputtered target material atoms. In an embodiment, power supply 113 generates RF discharge near the surface of the additional electrode 106. Additional electrode 106 is inductively grounded. RF discharge increases electron temperature and electron density and, therefore, the degree of ionization of sputtered target material atoms.

Figure 2:
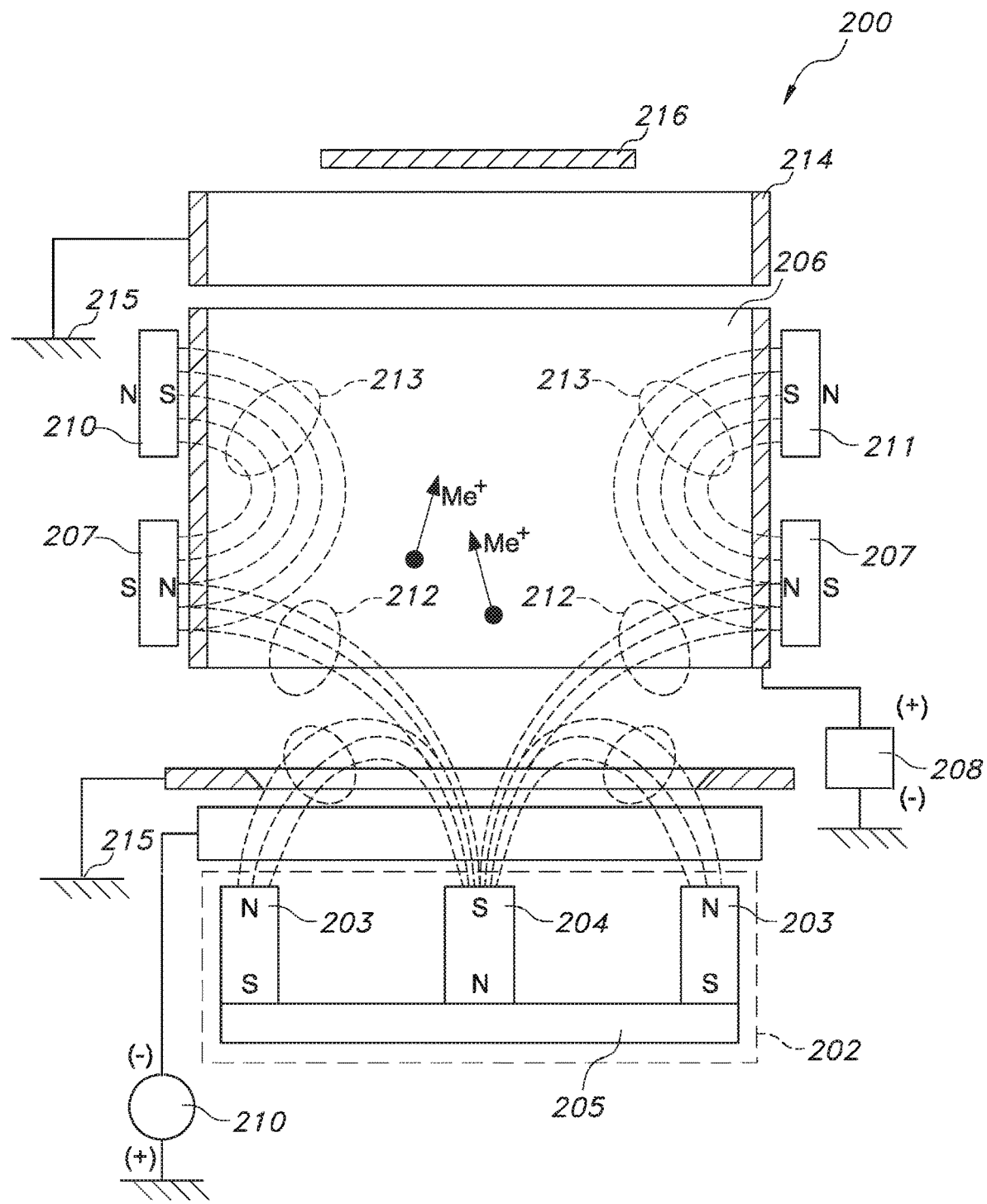
FIG. 2 shows an illustrative cross-sectional view of magnetic field lines of another embodiment of the electrically and magnetically enhanced I-PVD unbalanced magnetron sputtering source with two anode magnet assembles.
Figure 3:
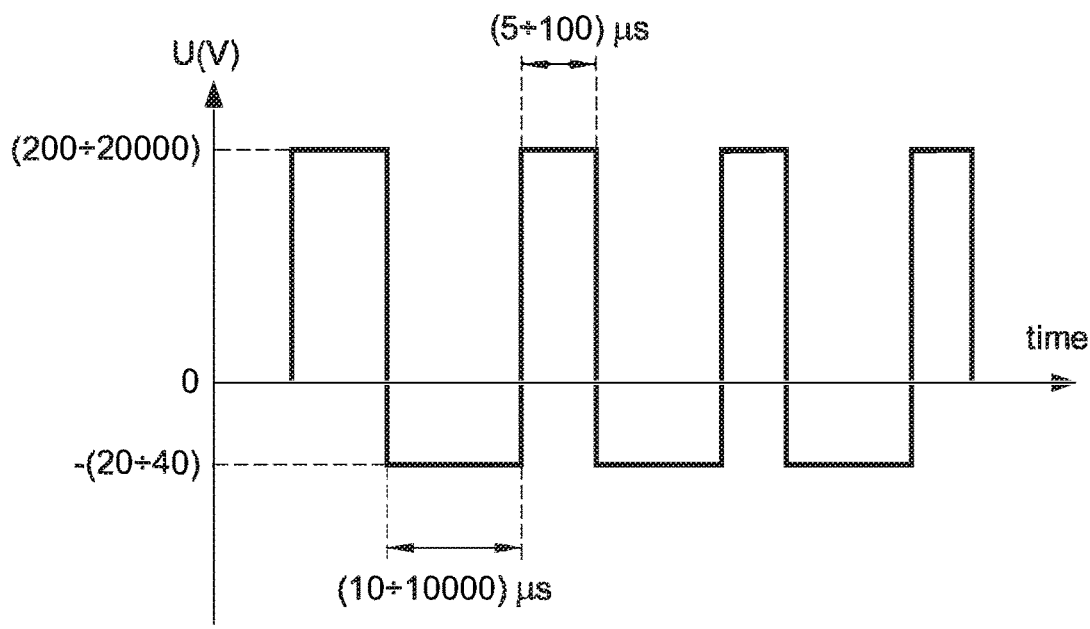
FIG. 3 shows an illustrative view of a bipolar voltage waveform that can be applied to the anode.

FIG. 2 shows a cross-sectional view 200 of magnetic field lines in an embodiment, in which an additional electrode 206 has two magnet assemblies. A cathode magnet assembly 202 includes magnets 203, 204 and magnetic pole piece 205. An anode 214 is positioned adjacent to the cathode target 209 and connected to ground 215. The cathode magnet assembly 202 forms a magnetron configuration with magnetic field lines 209 near the cathode target surface 201. A portion of the magnetic field lines 212 cross the additional electrode 206 and terminate on the magnet 207. The anode 214 is positioned adjacent to the additional electrode 206 and connected to ground 215. The additional electrode 206 is connected to power supply 208. In an embodiment, additional electrode 106 or 206 may have a floating electrical potential. The power supply 208 can generate floating, negative, or high frequency bipolar voltages. When power supply 210 generates power and a magnetron discharge is formed near the cathode target 201, electrons drift from the target surface towards the anode 206. If power supply 208 provides a negative voltage, electrons are trapped between target 201 and additional anode 206. Some electrons escape on the anode 214, which has a ground potential. By controlling the value and duration of the negative output voltage from the power supply, the electron density can be controlled. The applied negative voltage should not exceed a 40-50 V sputtering threshold in order to prevent sputtering from the additional electrode if the additional electrode is not made from the target material. Preferably, a negative voltage value should be in the range of −10 to −30 V. The electron density controls the degree of ionization of sputtered target material atoms. By controlling the value of the positive output voltage and time duration of the power supply 208, the ion energy and ion density near the substrate can be controlled. A typical rectangular bipolar output voltage provided by power supply 113 or 208 is shown in FIG. 3.

Figure 4:
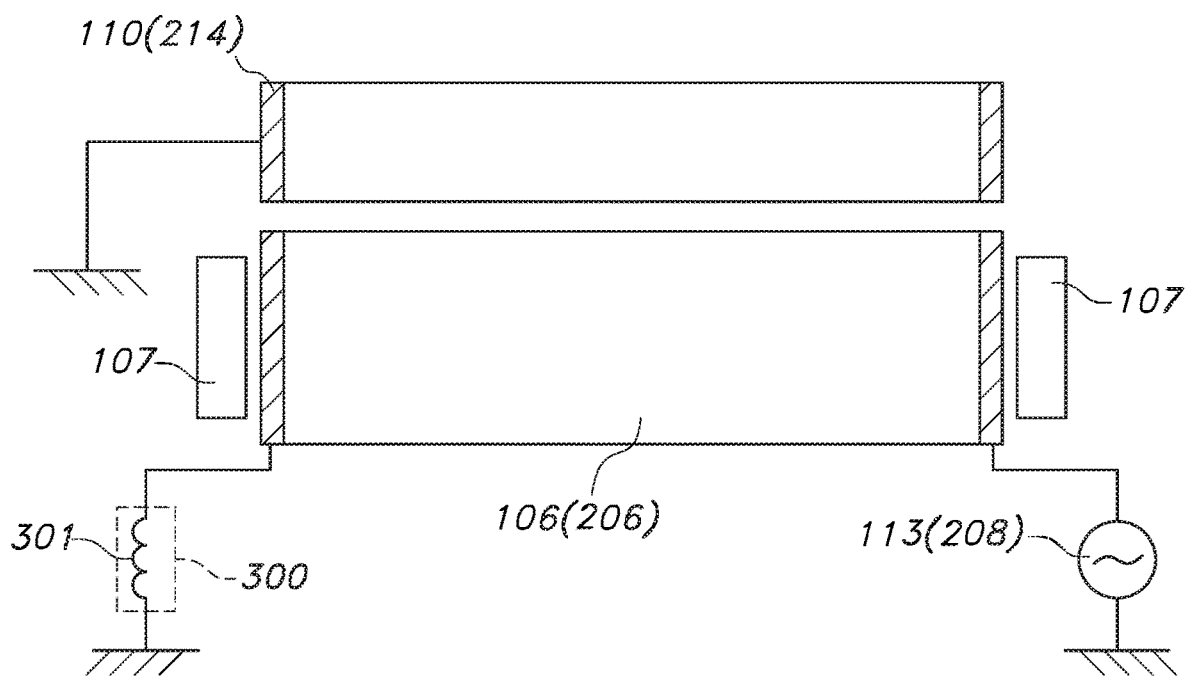
FIG. 4 shows an illustrative cross-sectional view of the anode magnet assembly connected to ground through an inductor and powered with a radio frequency (RF) power supply.
Figure 5A:
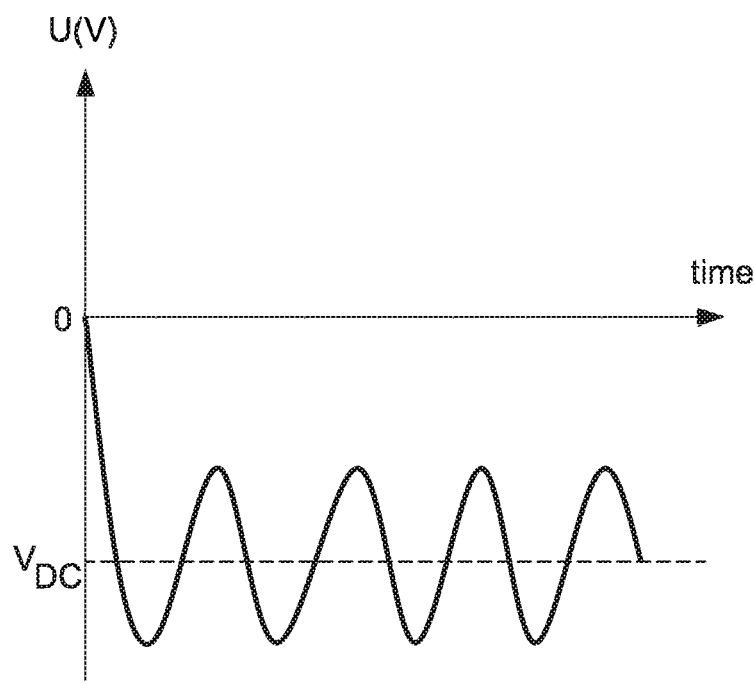
FIG. 5(a) shows a voltage waveform generated by the RF power supply on the anode when the anode is not connected to ground through the inductor.
Figure 5B:
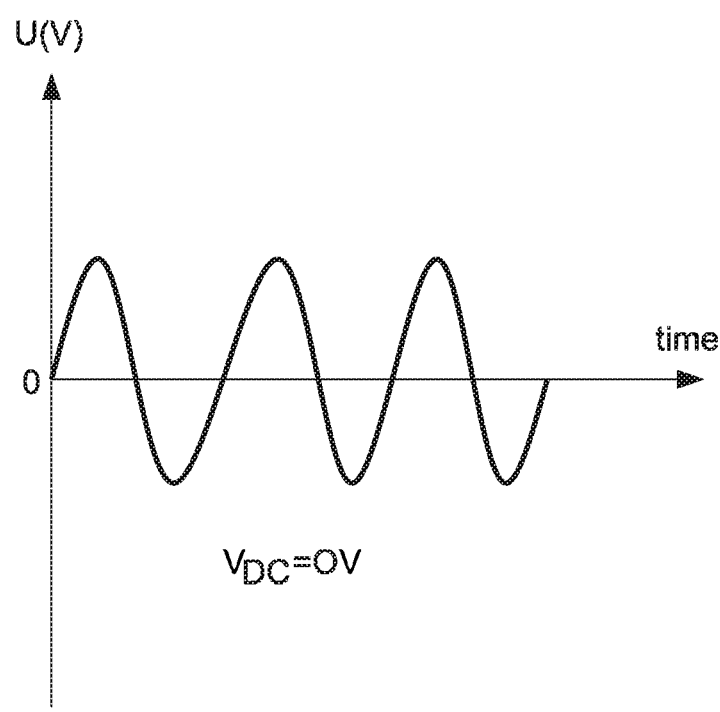
FIG. 5(b) shows a voltage waveform generated by the RF power supply on the anode when the anode is not connected to ground through the inductor.

Power supplies 113, 208 can be radio frequency (RF) power supplies that generate output voltages with frequencies in the range of 100 kHz to 100 MHz, as shown in FIG. 4. RF discharge has rectifying properties and generates a negative constant voltage bias $V_DC$ on the additional electrode 106, 206 surface as shown in FIG. 5(a). In order to eliminate this voltage bias and eliminate potential sputtering from the additional electrode, the additional electrode can be connected to ground through an electrical circuit 300 shown in FIG. 4. The electrical circuit 300 has at least one inductor 301 that has a high impedance for RF frequency signals and a substantially zero impedance for the DC current generated by a constant voltage bias. In this case, the additional electrodes 106, 206 are inductively grounded. The RF voltage signal, when additional electrodes 106, 206 are connected to electrical circuit 300, is shown in FIG. 5(b). In this case, if a DC or pulsed DC power supply is connected to the cathode target assembly, the additional electrode 106, 206 is the anode for only a direct current (DC) discharge. If an RF or pulsed RF power supply is connected to the cathode target assembly, additional electrode 106, 206 is an anode. For a high frequency component, the anode 110, 214 is used.

Figure 6:
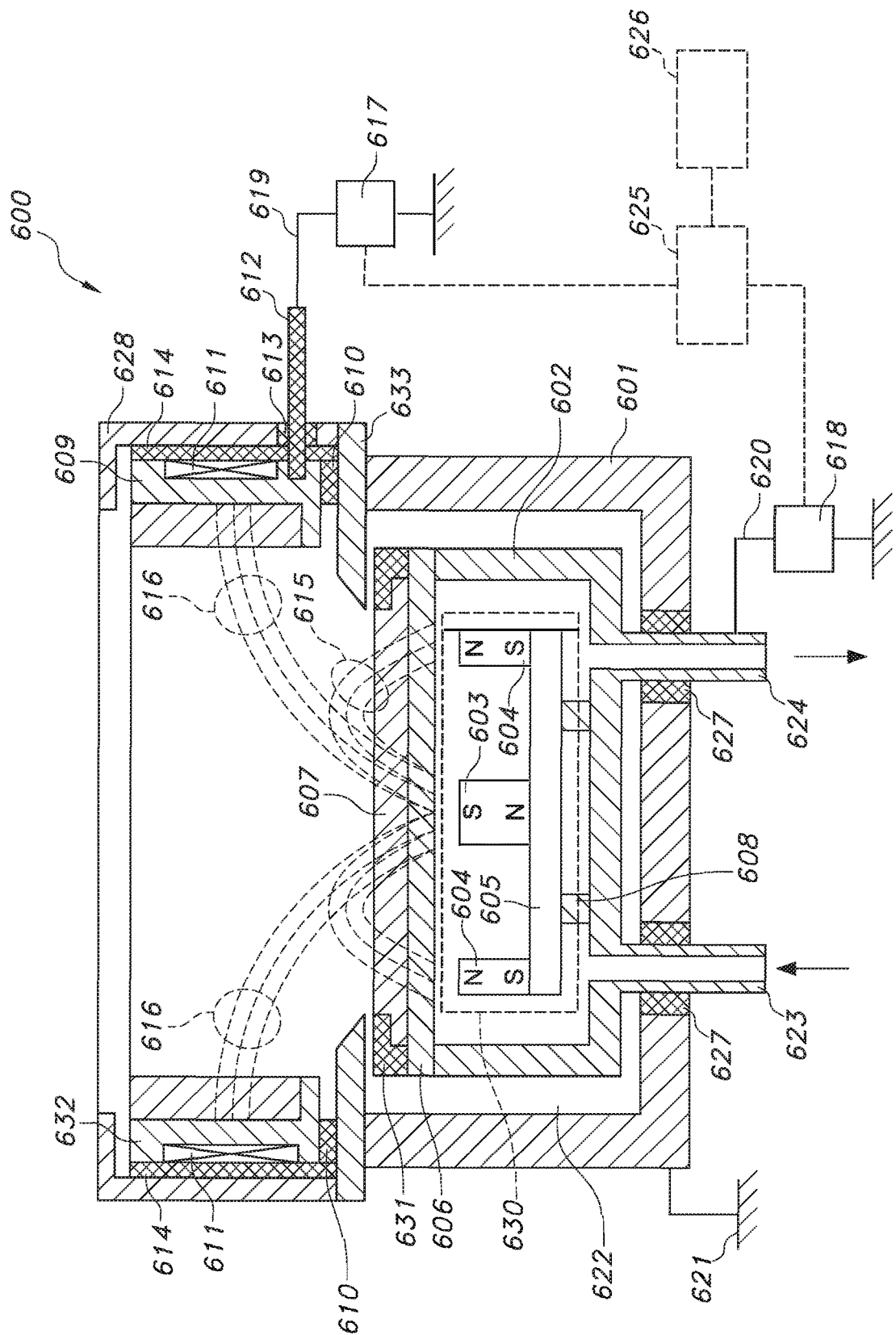
FIG. 6 shows an illustrative cross-sectional view of the electrically and magnetically enhanced I-PVD unbalanced magnetron sputtering source with an anode magnet assembly.

FIG. 6 shows a cross-sectional view of an embodiment of the electrically and magnetically enhanced ionized physical vapor deposition (I-PVD) unbalanced magnetron sputtering source 600. The electrically and magnetically enhanced I-PVD unbalanced magnetron sputtering source 600 includes a housing 601. The housing 601 is electrically connected to ground 621. The cathode assembly includes a water jacket 602 and a cathode target 607. The cathode target 607 can be bonded to the copper backing plate 606 or can be attached to the copper backing plate with a clamp 631. The anode 633 is positioned adjacent to the cathode target 607. The water jacket 602 is electrically isolated from the housing 601 with isolators 627. Water or another fluid for cooling can move inside the water jacket 602 through inlet 623 and can flow outside the water jacket 602 through the outlet 624. There is an air gap 622 between the housing 601 and water jacket 602. The water jacket 602 and, therefore, cathode target 607 are electrically connected to a negative terminal of a power supply 618 through a transmission line 620. The power supply 618 can include a radio frequency (RF) power supply, pulsed RF power supply, high frequency (HF) power supply, pulsed HF power supply, and a matching network. The power supply 618 can include a direct current (DC) power supply, a pulsed DC power supply that generates unipolar negative voltage pulses, a high power pulsed power supply, a pulsed DC power supply that generates asymmetrical bipolar voltage pulses, and a pulsed DC power supply that generates symmetrical bipolar voltage pulses. The power supply 618 can include a pulsed power supply that generates negative triangular voltage pulses. The power supply 618 can be a combination of any power supplies mentioned above. For example, the RF power supply can provide power together with the DC power supply, or the pulsed RF power supply can provide power together with the pulsed DC power supply, or any other pulse power supply. The frequency of the RF power supply and HF power supply can be in the range of 500 kHz-100 MHz. All of the above-mentioned power supplies can operate in current control mode, voltage control mode, and/or power control mode.

The cathode target 607 is formed in the shape of a disk, but can be formed in other shapes, such as a rectangle, and the like. The cathode target 607 material can be conductive, semi-conductive, and/or non-conductive. The following chemical elements, or their combination, can be used as a cathode material: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, and/or Ba. A combination of these chemical elements or their combination with the gases $O_2$, $N_2$, F, Cl, and/or $H_2$ can also be used as a cathode material. Power supply 618 can be connected to a controller 625 and computer 626. Controller 625 and/or computer 626 control the output power values and timing of the power supplies 618 and 617. Power supply 618 can operate as a standalone unit without connecting to controller and/or computer.

The cathode assembly includes a cathode magnetic assembly 630 positioned inside the water jacket 602. The cathode magnetic assembly 630 in an embodiment includes magnets 604, 603, and a disc-shaped magnetic pole piece 605 made from magnetic material, such as iron. Magnets 604, 603 form a magnetron configuration on the surface of the cathode target 607. The magnetron configuration has magnetic field lines 615.

A ring-shaped additional electrode 609 is positioned around the cathode target 607 on the supporter 632. An additional electrode magnet assembly has a cylindrical shape and is positioned behind the ring-shaped additional electrode 609 in the supporter 632. The anode magnet assembly includes a plurality of permanent magnets 611. In an embodiment, rather than using permanent magnets, electromagnets can be used. The value of the magnetic field caused by the permanent magnets 611 is in a range of 100 to 1000 G. The magnets 611 provide magnetic coupling with magnet 603 and, therefore, with a surface of the target 607 through magnetic field lines 616. In an embodiment, the magnet 611 provides magnetic coupling with magnets 604.

The additional electrode 609 is electrically isolated from a ground shield 628 by isolators 614, 610, 613. The additional electrode 609 is connected to power supply 617 through transmission line 619, and electrode 612. Power supply 617 can be connected to controller 625.

The magnetic fields 616 shown in FIG. 6 are shaped to provide electron movement between the cathode target 607 and additional electrode 609. During this movement, electrons ionize and/or dissociate feed gas molecules and/or sputtered target material atoms.

Figure 7A:
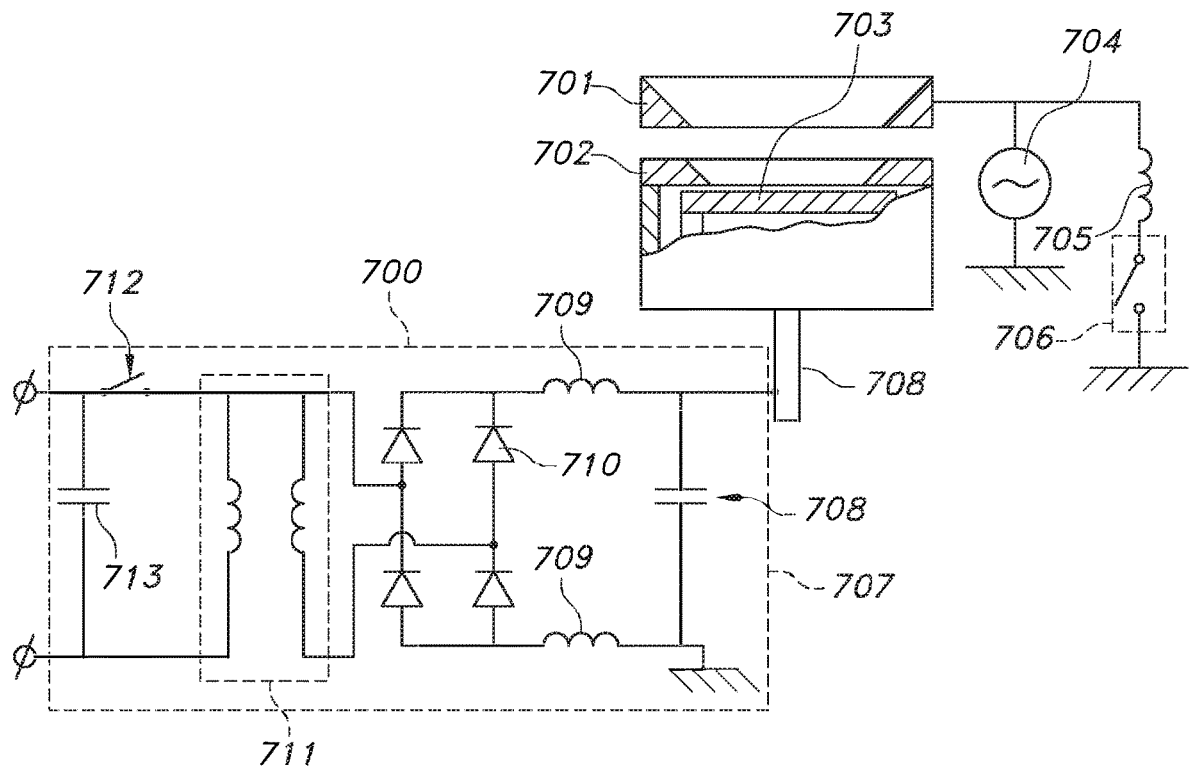
FIG. 7(a) shows an illustrative cross-sectional view of the electrically and magnetically enhanced I-PVD unbalanced magnetron sputtering source including an additional electrode connected with the RF power supply and the cathode target connected to a high power pulsed power supply.
Figure 7B:
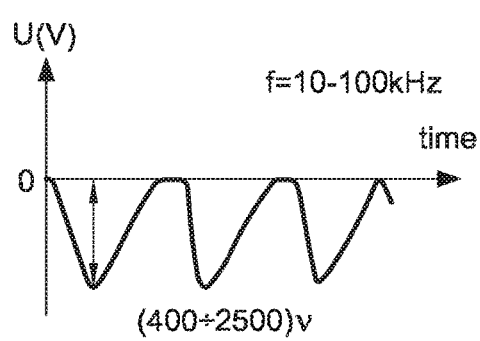
FIGS. 7(b, c) show output voltage waveforms from the high power pulsed power supply shown in FIG. 7(a)
FIG. 7(d) shows an illustrative cross-sectional view of the additional electrode and gap electrode assembly.
FIG. 7(e) shows an illustrative cross-sectional view of the magnetic field lines between magnetron sputtering source and cusp magnetic field near the additional electrode.
Figure 7C:
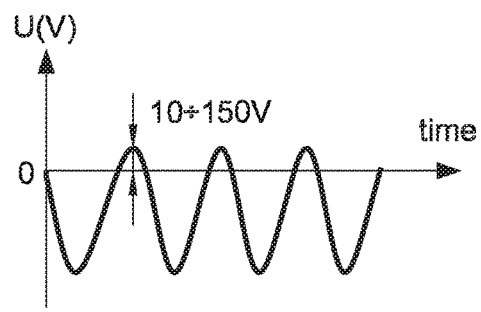

FIG. 7(a) shows the additional electrode 701 connected to RF power supply 704 and inductively grounded through inductor 705 and switch 706. The cathode target 703 is connected to a high power pulsed power supply that generates oscillatory voltage with frequency in a range of 10 to 100 KHz. The block diagram of the high power supply shows capacitor bank 713 and solid state switch 712, which can release energy from the capacitor 713 to transformer 711. Transformer 711, diodes 710, inductors 709, and capacitor 708 form oscillatory voltage waveforms, as shown in FIGS. 7(b), (c).

In an embodiment, the additional electrode 738 is positioned behind the gap 739 as shown in FIG. 7 (d). The additional electrode 738 has two rows of permanent magnets that form a cusp magnetic field in the gap 739. Two pole pieces 736, 731 are positioned on top and bottom of the magnets 728, 729. Additional electrode 738 has anode 723. The anode 723 has feed gas chamber 725 and feed gas inlet 724. The feed enters through a plurality of cylindrical holes 727. The additional electrode can be connected to power supply 732 through transmission line 735. The power supply 732 can be an RF power supply that generates output voltage with frequencies in the range of 100 KHz and 100 MHz. The power supply 732 can be a pulsed power supply or DC (direct current) power supply. The additional electrode 738 can be grounded through inductor 755. The gap 739 is formed between the anode 723 and gap electrode 722. The gap electrode 722 is positioned behind the grounded shield 720. The additional electrode 738 is positioned on the isolator 730. The gap electrode 722 is positioned on isolator 721. The gap electrode is connected to the power supply 733. The power supply 733 can be an RF power supply that generates output voltage with frequencies in the range of 100 KHz to 100 MHz. The power supply 733 can be a pulsed power supply or DC power supply. The gap electrode can be grounded through inductor 754. The electric field in the gap 739 is substantially perpendicular to magnetic field lines. The magnetic field lines are shown in FIG. 7(e). In an embodiment, the gap electrode 722 has a ground potential and power supply 732 releases voltage on additional electrode 738. In an embodiment, additional electrode 738 has a ground potential or floating potential, and power supply 733 releases voltage on gap electrode 722.

Figure 7D:
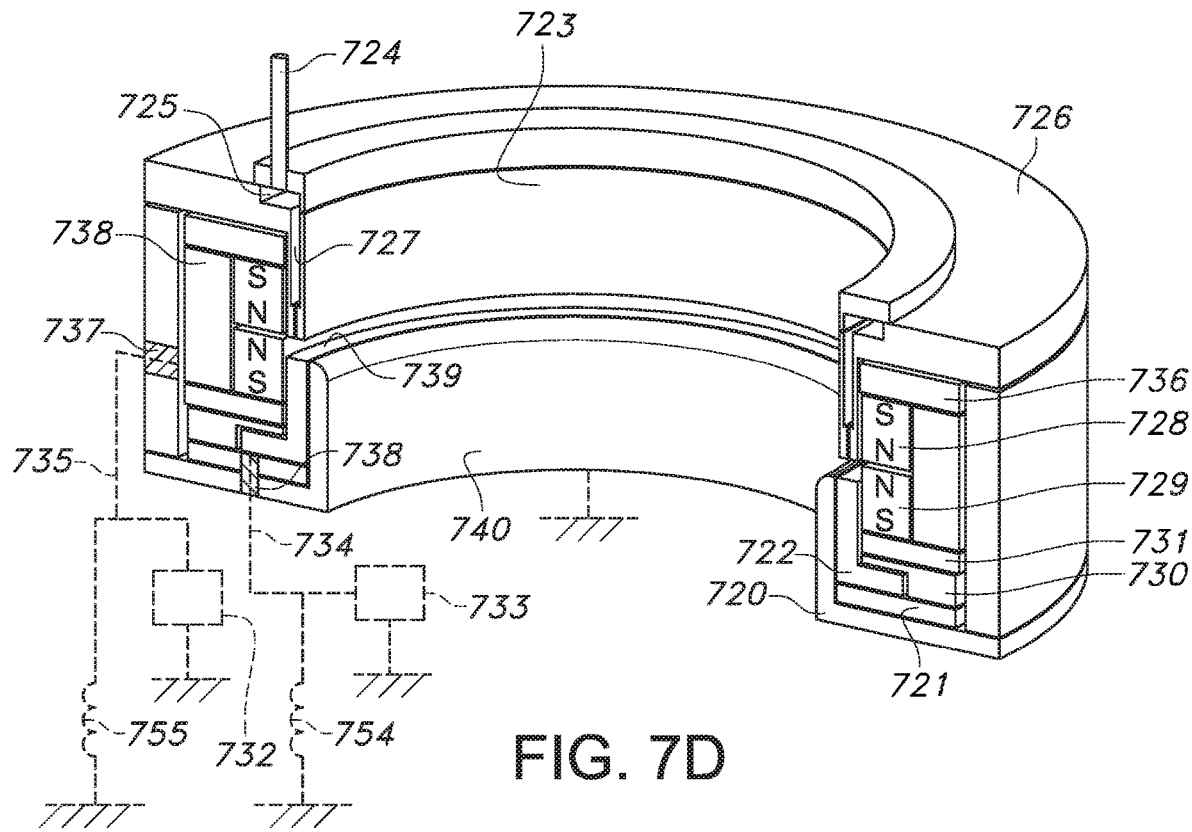
Figure 7E:
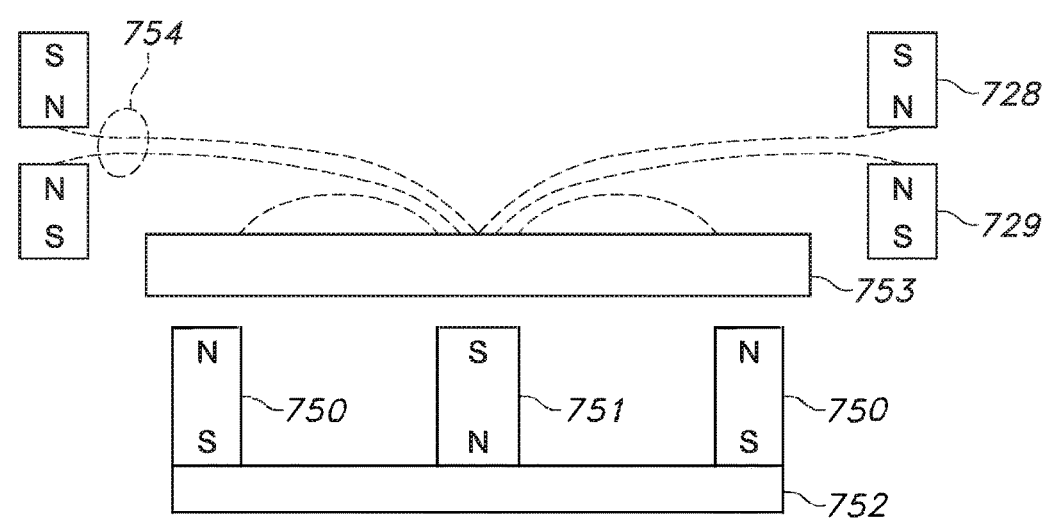

Magnetic field lines are shown in FIG. 7(e). Magnets 750, 751 and magnetic pole piece 752 form a magnetron configuration on the cathode target 753. Magnets 728 and 729 form a cusp magnetic field 754.

Figure 8A:
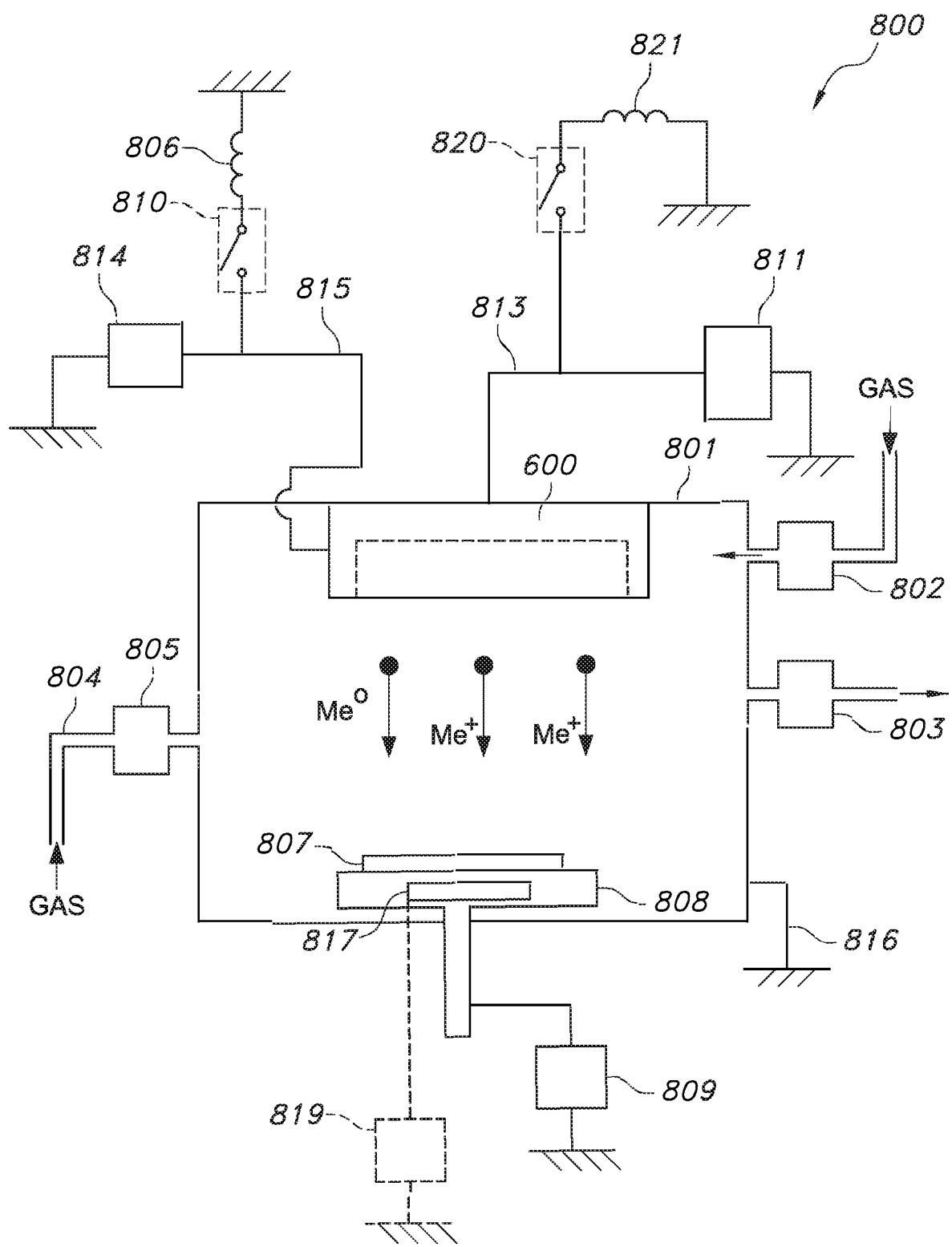
FIG. 8(a) shows an illustrative cross-sectional view of an electrically and magnetically enhanced I-PVD unbalanced magnetron sputtering system.

The electrically and magnetically enhanced I-PVD unbalanced magnetron sputtering source 600 can be mounted inside a vacuum chamber 801 as shown in FIG. 8 in order to construct the electrically and magnetically enhanced I-PVD unbalanced magnetron sputtering apparatus 800. The vacuum chamber 801 contains feed gas and plasma. The vacuum chamber 801 is coupled to ground 816. The vacuum chamber 801 is positioned in fluid communication with a vacuum pump 803, which can evacuate the feed gas from the vacuum chamber 801. Typical baseline pressure in the vacuum chamber 801 is in a range of $10^{-6}$-$10^{-9}$ Torr.

A feed gas is introduced into the vacuum chamber 801 through a gas inlet 804 from a feed gas source. In an embodiment, a feed gas is introduced into the vacuum chamber 801 through a gas activation source 802. A mass flow controller 805 controls gas flow to the vacuum chamber 801. In an embodiment, the vacuum chamber 801 has a plurality of gas inlets and mass flow controllers. The gas flow can be in a range of 1 to 1000 SCCM depending on plasma operating conditions, pumping speed of the vacuum pump 803, process conditions, and the like. Typical gas pressure in the vacuum chamber 801 during a sputtering process can be in a range of 0.1 mTorr to 100 mTorr. In an embodiment, a plurality of gas inlets and a plurality of mass flow controllers sustain a desired gas pressure during the sputtering process. The plurality of gas inlets and plurality of mass flow controllers may be positioned in the vacuum chamber 801 at different locations. The feed gas can be a noble gas, such as Ar, Ne, Kr, Xe; a reactive gas, such as $N_2$, $O_2$; or any other gas that are suitable for sputtering or reactive sputtering processes. The feed gas can also be a mixture of noble and reactive gases. The feed gas can be a gas that contains the same atoms as a target material.

In an embodiment, the target material is carbon. The feed gases are $C_2H_2$ or any other gas that contains carbon atoms and a noble gas such as argon.

FIG. 8 shows an embodiment of an electrically and magnetically enhanced magnetron sputtering apparatus 800, which includes a substrate support 808 that holds a substrate 807 or other work piece for plasma processing. The substrate support 808 is electrically connected to the bias voltage power supplies 809. The bias voltage power supplies 809 can include a radio frequency (RF) power supply, alternating current (AC) power supply, and very high frequency (VHF) power supply, and/or direct current (DC) power supply, high power pulse power supply. The bias power supply 809 can operate in continuous mode or pulse mode. The bias power supply 809 can be combination of different power supplies that can provide different frequencies. The negative bias voltage on the substrate can be in a range of 0 and −2000 V. The negative substrate bias voltage can attract positive ions to the substrate. At bias voltages in the range of −800 V and −1000 V the ions from sputtered target material atoms can etch substrate surface. At higher bias voltage sputtered target material ions can be implanted to substrate surface. The substrate support 808 can include a heater 817 that is connected to a temperature controller 818 (exact connection is not shown). The temperature controller 818 regulates the temperature of the substrate 807. In an embodiment, the temperature controller 710 controls the temperature of the substrate 807 to be in a range of −20 C.—(+400) C.

The cathode target from the electrically and magnetically enhanced magnetron sputtering source is connected to power supply 811 through transmission line 813. The additional electrode from the electrically enhanced sputtering source is connected to power supply 814 through the transmission line 815. If power supply 814 is an RF power supply, the additional electrode can be inductively grounded through inductor 806 and switch 810. In an embodiment, there is no switch 810. If power supply 811 is an RF power supply. the additional cathode target assembly can be inductively grounded through inductor 821 and switch 820. In an embodiment, there is no switch 820.

During sputtering, a noble gas, such as argon, is flowing in the chamber 801 through inlet 804 or gas activation source 802. The gas pressure can be in the range of 0.5-50 mTorr. The substrate bias can be between −10 V and −200 V. In an embodiment, power supply 811 generates pulsed power with triangular or rectangular voltage pulse shapes or any other voltage pulse shapes. The pulsed power supply can generate asymmetrical bipolar pulses. At the same time, power supply 814 generates pulsed or continuous RF discharge near the additional electrode. This RF discharge increases the electron energy and electron density, thereby increasing the ionization rate of the sputtered target material atoms. That is, the pulsed power supply connected to the cathode target controls the deposition rate, and the RF power supply that is connected to the additional electrode controls plasma density and electron energy. The RF power can be in the range of 1-20 kW. In an embodiment, power supply 811 generates DC power. The DC power can be in the range of 1-100 kW depending on the area of the cathode target.

In an embodiment, a cathode target magnet assembly includes multiple small magnetrons. In an embodiment, one part of the cathode target magnet assembly forms a magnetron configuration and another part forms a non magnetron configuration.

The electrically and magnetically enhanced ionized physical vapor deposition (I-PVD) unbalanced magnetron sputtering apparatus can be configured for chemically enhanced I-PVD, plasma enhanced CVD, reactive ion etch (RIE), or sputter etch applications. Typically, for CVD, RIE, and sputter etch applications, the cathode target assembly and additional electrodes are connected to the RF power supplies and are inductively grounded. The RF frequency on the additional electrode and cathode target assembly can be different. In an embodiment, the RF frequency on the additional electrode is 27 MHz, and the RF frequency on the cathode target assembly is 13.56 MHz. The RF power supplies 814, 811 can be pulsed RF power supplies and can be synchronized. The cathode target magnet assembly for CVD, RIE, and sputter etch applications can have magnet assemblies that generate magnetic field lines, which are substantially perpendicular to the cathode surface.

Figure 8B:
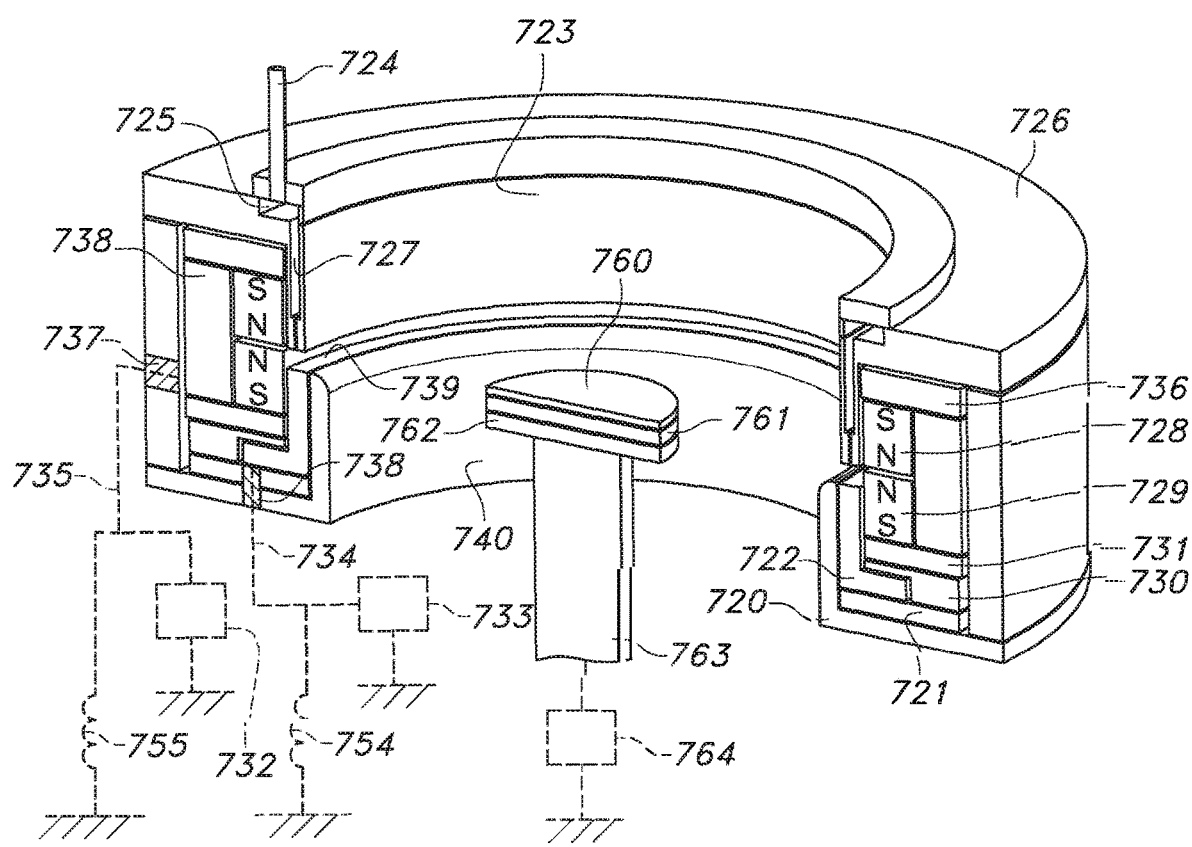
FIG. 8(b) shows an illustrative cross-sectional view of the additional electrode and gap electrode assembly together with the substrate.

In some embodiments, the assembly of the additional electrode and the gap electrode that is shown in FIG. 7(d) can be used separately from the magnetron sputtering source as shown in FIG. 8(b). A substrate 760 is positioned on the magnetic pole piece 761 and heater 762. Supporter 763 is connected to substrate bias power supply 764. This configuration can be used for CVD and RIE applications.

Figure 9:
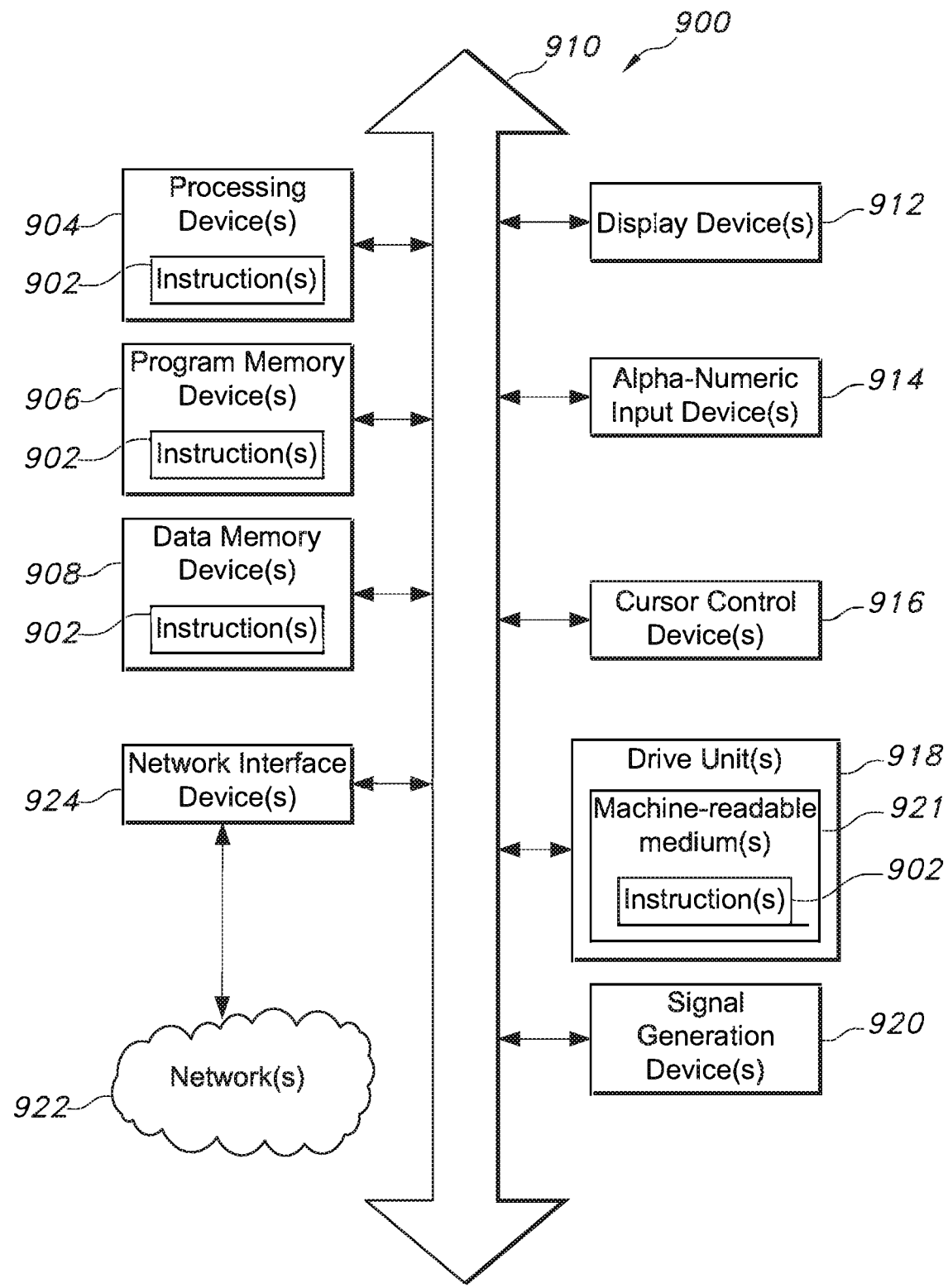
FIG. 9 shows a block diagram of at least a portion of an exemplary machine in the form of a computing system that performs methods according to one or more embodiments disclosed herein.

One or more embodiments disclosed herein, or a portion thereof, may make use of software running on a computer or workstation. By way of example, only and without limitation, FIG. 9 is a block diagram of an embodiment of a machine in the form of a computing system 900, within which is a set of instructions 902 that, when executed, cause the machine to perform any one or more of the methodologies according to embodiments of the invention. In one or more embodiments, the machine operates as a standalone device; in one or more other embodiments, the machine is connected (e.g., via a network 922) to other machines. In a networked implementation, the machine operates in the capacity of a server or a client user machine in a server-client user network environment. Exemplary implementations of the machine as contemplated by embodiments of the invention include, but are not limited to, a server computer, client user computer, personal computer (PC), tablet PC, personal digital assistant (PDA), cellular telephone, mobile device, palmtop computer, laptop computer, desktop computer, communication device, personal trusted device, web appliance, network router, switch or bridge, or any machine capable of executing a set of instructions (sequential or otherwise) that specify actions to be taken by that machine.

The computing system 900 includes a processing device(s) 904 (e.g., a central processing unit (CPU), a graphics processing unit (GPU), or both), program memory device(s) 906, and data memory device(s) 908, which communicate with each other via a bus 910. The computing system 900 further includes display device(s) 912 (e.g., liquid crystal display (LCD), flat panel, solid state display, or cathode ray tube (CRT)). The computing system 900 includes input device(s) 914 (e.g., a keyboard), cursor control device(s) 916 (e.g., a mouse), disk drive unit(s) 918, signal generation device(s) 920 (e.g., a speaker or remote control), and network interface device(s) 924, operatively coupled together, and/or with other functional blocks, via bus 910.

The disk drive unit(s) 918 includes machine-readable medium(s) 926, on which is stored one or more sets of instructions 902 (e.g., software) embodying any one or more of the methodologies or functions herein, including those methods illustrated herein. The instructions 902 may also reside, completely or at least partially, within the program memory device(s) 906, the data memory device(s) 908, and/or the processing device(s) 904 during execution thereof by the computing system 900. The program memory device(s) 906 and the processing device(s) 904 also constitute machine-readable media. Dedicated hardware implementations, such as but not limited to ASICs, programmable logic arrays, and other hardware devices can likewise be constructed to implement methods described herein. Applications that include the apparatus and systems of various embodiments broadly comprise a variety of electronic and computer systems. Some embodiments implement functions in two or more specific interconnected hardware modules or devices with related control and data signals communicated between and through the modules, or as portions of an ASIC. Thus, the example system is applicable to software, firmware, and/or hardware implementations.

The term "processing device" as used herein is intended to include any processor, such as, for example, one that includes a CPU (central processing unit) and/or other forms of processing circuitry. Further, the term "processing device" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the display device(s) 912, input device(s) 914, cursor control device(s) 916, signal generation device(s) 920, etc., can be collectively referred to as an "input/output interface," and is intended to include one or more mechanisms for inputting data to the processing device(s) 904, and one or more mechanisms for providing results associated with the processing device(s). Input/output or I/O devices (including but not limited to keyboards (e.g., alpha-numeric input device(s) 914, display device(s) 912, and the like) can be coupled to the system either directly (such as via bus 910) or through intervening input/output controllers (omitted for clarity).

In an integrated circuit implementation of one or more embodiments of the invention, multiple identical die are typically fabricated in a repeated pattern on a surface of a semiconductor wafer. Each such die may include a device described herein, and may include other structures and/or circuits. The individual dies are cut or diced from the wafer, then packaged as integrated circuits. One skilled in the art would know how to dice wafers and package die to produce integrated circuits. Any of the exemplary circuits or method illustrated in the accompanying figures, or portions thereof, may be part of an integrated circuit. Integrated circuits so manufactured are considered part of this invention.

An integrated circuit in accordance with the embodiments of the present invention can be employed in essentially any application and/or electronic system in which buffers are utilized. Suitable systems for implementing one or more embodiments of the invention include, but are not limited to, personal computers, interface devices (e.g., interface networks, high-speed memory interfaces (e.g., DDR3, DDR4), etc.), data storage systems (e.g., RAID system), data servers, etc. Systems incorporating such integrated circuits are considered part of embodiments of the invention. Given the teachings provided herein, one of ordinary skill in the art will be able to contemplate other implementations and applications.

In accordance with various embodiments, the methods, functions or logic described herein is implemented as one or more software programs running on a computer processor. Dedicated hardware implementations including, but not limited to, application specific integrated circuits, programmable logic arrays and other hardware devices can likewise be constructed to implement the methods described herein. Further, alternative software implementations including, but not limited to, distributed processing or component/object distributed processing, parallel processing, or virtual machine processing can also be constructed to implement the methods, functions or logic described herein.

The embodiment contemplates a machine-readable medium or computer-readable medium containing instructions 902, or that which receives and executes instructions 902 from a propagated signal so that a device connected to a network environment 922 can send or receive voice, video or data, and to communicate over the network 922 using the instructions 902. The instructions 902 are further transmitted or received over the network 922 via the network interface device(s) 924. The machine-readable medium also contains a data structure for storing data useful in providing a functional relationship between the data and a machine or computer in an illustrative embodiment of the systems and methods herein.

While the machine-readable medium 902 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding, or carrying a set of instructions for execution by the machine and that cause the machine to perform anyone or more of the methodologies of the embodiment. The term "machine-readable medium" shall accordingly be taken to include, but not be limited to: solid-state memory (e.g., solid-state drive (SSD), flash memory, etc.); read-only memory (ROM), or other non-volatile memory; random access memory (RAM), or other re-writable (volatile) memory; magneto-optical or optical medium, such as a disk or tape; and/or a digital file attachment to e-mail or other self-contained information archive or set of archives is considered a distribution medium equivalent to a tangible storage medium. Accordingly, the embodiment is considered to include anyone or more of a tangible machine-readable medium or a tangible distribution medium, as listed herein and including art-recognized equivalents and successor media, in which the software implementations herein are stored.

It should also be noted that software, which implements the methods, functions and/or logic herein, are optionally stored on a tangible storage medium, such as: a magnetic medium, such as a disk or tape; a magneto-optical or optical medium, such as a disk; or a solid state medium, such as a memory automobile or other package that houses one or more read-only (non-volatile) memories, random access memories, or other re-writable (volatile) memories. A digital file attachment to e-mail or other self-contained information archive or set of archives is considered a distribution medium equivalent to a tangible storage medium. Accordingly, the disclosure is considered to include a tangible storage medium or distribution medium as listed herein and other equivalents and successor media, in which the software implementations herein are stored.

Although the specification describes components and functions implemented in the embodiments with reference to particular standards and protocols, the embodiment are not limited to such standards and protocols.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments are utilized and derived therefrom, such that structural and logical substitutions and changes are made without departing from the scope of this disclosure. Figures are also merely representational and are not drawn to scale. Certain proportions thereof are exaggerated, while others are decreased. Accordingly, the specification and drawings are to be regarded in an illustrative rather than a restrictive sense.

Such embodiments are referred to herein, individually and/or collectively, by the term "embodiment" merely for convenience and without intending to voluntarily limit the scope of this application to any single embodiment or inventive concept if more than one is in fact shown. Thus, although specific embodiments have been illustrated and described herein, it should be appreciated that any arrangement calculated to achieve the same purpose are substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single embodiment. Thus, the following claims are hereby incorporated into the detailed description, with each claim standing on its own as a separate example embodiment.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single embodiment. Thus, the following claims are hereby incorporated into the Detailed Description, with each claim standing on its own as separately claimed subject matter.

Although specific example embodiments have been described, it will be evident that various modifications and changes are made to these embodiments without departing from the broader scope of the inventive subject matter described herein. Accordingly, the specification and drawings are to be regarded in an illustrative rather than a restrictive sense. The accompanying drawings that form a part hereof, show by way of illustration, and without limitation, specific embodiments in which the subject matter are practiced. The embodiments illustrated are described in sufficient detail to enable those skilled in the art to practice the teachings herein. Other embodiments are utilized and derived therefrom, such that structural and logical substitutions and changes are made without departing from the scope of this disclosure. This Detailed Description, therefore, is not to be taken in a limiting sense, and the scope of various embodiments is defined only by the appended claims, along with the full range of equivalents to which such claims are entitled.

Given the teachings provided herein, one of ordinary skill in the art will be able to contemplate other implementations and applications of the techniques of the disclosed embodiments. Although illustrative embodiments have been described herein with reference to the accompanying drawings, it is to be understood that these embodiments are not limited to the disclosed embodiments, and that various other changes and modifications are made therein by one skilled in the art without departing from the scope of the appended claims.

What is claimed is:

1. A magnetically and electrically enhanced apparatus configured to perform at least one of chemical vapor deposition (CVD) and reactive ion etching (RIE), the apparatus comprising:
   an anode positioned on top of a ring electrode, thereby forming a gap between the anode and the ring electrode;
   a cathode target assembly positioned inside the ring electrode;
   two rows of magnets generating a cusp magnetic field in the gap and a magnetic field on the cathode target assembly such that a portion of magnetic field lines are substantially perpendicular to the cathode target assembly;
   an inductor positioned between the ring electrode and a ground;
   an inductor positioned between the cathode target assembly and the ground;
   a first radio frequency (RF) power supply connected to the ring electrode, the first RF power supply generating a first RF electric field in the gap perpendicular to the magnetic field lines, the first RF electric field igniting and sustaining plasma in the gap; and
   a second RF power supply connected to the cathode target assembly, the second RF power supply generating a second RF electric field adjacent to the cathode target assembly, the second RF electric field sustaining plasma adjacent to the cathode target assembly, a frequency and power associated with the second RF power supply being selected to increase a degree of dissociation and ionization of feed gas molecules and atoms.

2. The magnetically and electrically enhanced apparatus, as defined by claim 1, wherein the first and second radio frequency (RF) power supplies generate output voltage with a frequency in a range of about 1 MHz to 100 MHz.

3. The magnetically and electrically enhanced apparatus, as defined by claim 1, wherein the cathode target is replaced by substrate holder.

4. The magnetically and electrically enhanced apparatus, as defined by claim 1, further comprising:
a substrate holder; and
an RF substrate bias power supply connected to the substrate holder, the RF substrate bias power supply generating a bias voltage on the substrate in a range of about −10 V to −2000 V.

5. The magnetically and electrically enhanced apparatus, as defined by claim 3, further comprising an inductor connected between the substrate holder and the ground.

6. The magnetically and electrically enhanced apparatus, as defined by claim 1, wherein at least one of the cusp magnetic field in the gap and the magnetic field on the cathode target assembly is in a range of about 50 G to 5000 G.

7. The magnetically and electrically enhanced apparatus, as defined by claim 1, wherein the cathode target assembly is rotatable.

8. A method of performing at least one of chemical vapor deposition (CVD) and reactive ion etching (RIE) using a magnetically and electrically enhanced apparatus, the method comprising:
providing a ring electrode;
forming a gap between the ring electrode and an anode;
positioning a cathode target and cathode target magnet assembly inside the ring electrode;
generating a cusp magnetic field in the gap such that magnetic field lines are substantially perpendicular to the cathode target magnet assembly;
providing a first radio frequency (RF) power to the ring electrode that ignites and sustains plasma discharge in the gap;
providing a second RF power to the cathode target that sustains plasma discharge adjacent to the cathode target assembly; and
selecting a frequency and the second RF power to increase a degree of dissociation and ionization of feed gas molecules and atoms.

9. The method, as defined by claim 8, further comprising connecting an inductor between the ring electrode and a ground.

10. The method, as defined by claim 8, further comprising connecting an inductor between the cathode target magnet assembly and a ground.

11. The method, as defined by claim 8, further comprising:
connecting a substrate holder to a substrate bias power supply; and
providing a bias voltage on the substrate in a range of about −10 V to −2000 V.

12. The method, as defined by claim 8, wherein the magnetic field in the gap is in a range of about 50 G to 10000 G.

13. The method, as defined by claim 8, wherein the cathode target magnet assembly comprises carbon.

* * * * *